United States Patent

Huang et al.

[11] Patent Number: 5,981,395
[45] Date of Patent: Nov. 9, 1999

[54] METHOD OF FABRICATING AN UNLANDED METAL VIA OF MULTI-LEVEL INTERCONNECTION

[75] Inventors: Yimin Huang, Taichung Hsien; Tri-Rung Yew, Hsinchu Hsien, both of Taiwan

[73] Assignee: United Microelectronics Corp., Hsinchu, Taiwan

[21] Appl. No.: 08/994,157

[22] Filed: Dec. 19, 1997

[30] Foreign Application Priority Data

Oct. 18, 1997 [TW] Taiwan ................................ 86115352

[51] Int. Cl.$^6$ .................................................. H01L 21/302
[52] U.S. Cl. ............................................. 438/692; 438/692
[58] Field of Search ..................................... 438/691, 692, 438/622, 634, 637, 669, 688

[56] References Cited

U.S. PATENT DOCUMENTS

| | | | |
|---|---|---|---|
| 4,381,595 | 5/1983 | Denda et al. ............................ | 438/624 |
| 4,789,648 | 12/1988 | Chow et al. ............................ | 438/633 |
| 4,948,755 | 8/1990 | Mo ........................................... | 438/625 |
| 5,141,897 | 8/1992 | Manocha et al. ....................... | 438/625 |
| 5,169,802 | 12/1992 | Yeh ......................................... | 438/637 |
| 5,272,117 | 12/1993 | Roth et al. ................................ | 438/14 |
| 5,371,410 | 12/1994 | Chen et al. ............................. | 257/750 |
| 5,382,545 | 1/1995 | Houng ..................................... | 438/624 |
| 5,451,543 | 9/1995 | Woo et al. ............................... | 438/637 |

*Primary Examiner*—Felisa Hiteshen
*Assistant Examiner*—Bernadine Okoro

[57] ABSTRACT

A method of fabricating an unlanded metal via of multi-level interconnection. The method is characterized by utilizing damascene scheme to form a metal wiring layer so that the processes are simplified. Moreover, by this method of the invention, a problem of difficulty in filling dielectric material between the metal wiring lines can be avoided and the metal layer does not have to be etched prior to filling the dielectric material. Further more, an etching stop layer is formed over the first inter-metal dielectric layer to avoid overetching during the formation of metal via, which therefore avoid short circuit. Forming the metal wiring lines by damascene scheme allows the etching stop layer to be easily formed over the first dielectric layer, without over etching the metal via.

9 Claims, 5 Drawing Sheets

METHOD OF FABRICATING AN UNLANDED METAL VIA OF MULTI-LEVEL INTERCONNECTION

BACKGROUND OF THE INVENTION

1. Field of the Invention

The invention relates in general to the fabrication of a metal via of multi-level interconnection in the process of forming a metal-oxide-semiconductor device (MOS), and more particularly to the method of forming an unlanded via of multi-level interconnection, making use of damascene scheme.

2. Description of the Related Art

The increasing of the integrality of the integrated circuited (IC) causes the insufficiency of the chip surface for formation of interconnection. To satisfy the requirement of more wiring lines as the device size is shrinking, a design of multi-level interconnection is needed for IC fabrication.

Conventionally, a via with wider line width, called a landed via, is frequently utilized to prevent misalignment and to ensure the tight contact of the metal via and metal wiring line. However, the landed via occupies extra chip surface area, which is not suitable for current IC fabrication process.

Therefore, as higher integrality is strongly required, an unlanded via, having equal line with as the wiring line, is developed. The chip surface area is less occupied by using the unlanded via so that the IC integrality can be increased. However, another problem arises by utilizing unlanded via, which is, the unlanded via can not completely fall on the metal wiring lines.

A process flow showing the formation of a conventional unlanded via of multi-level interconnection is illustrated through FIG. 1A to FIG. 1D. Referring first to FIG. 1A, a first metal layer 12, such as aluminum, is formed over a substrate 10, having a MOS device formed thereon. The first metal layer 12 is then patterned to form a first metal wiring line 12a, as shown in FIG. 1B. An inter-metal dielectric layer 14, such as silicon dioxide, is formed over the first metal wiring line 12a. The inter-metal dielectric layer 14 is next processed through chemical mechanical polish to planarize its surface.

Next, referring to FIG. 1C, the inner dielectric layer 14 is patterned to form a metal via 16, exposing the first metal wiring line 12a. A metal plug 18, such as a tungsten plug, is then formed in the metal via 16.

Referring to FIG. 1D, a second metal layer 19, such as aluminum, is formed over the inter-metal dielectric layer 14 and the metal plug 18. The second metal layer 19 is then patterned to form a second metal wiring line 19a, which are coupled to the metal plugs 18. A conventional unlanded via is therefore completed.

In the conventional processes of fabricating an unlanded via, misalignment tends to occur as the inter-metal dielectric layer 14 is patterned. The misalignment usually causes overetching, or more seriously, piercing of the inner dielectric layer 14 during the formation of the via. As the inter-metal dielectric layer 14 is pierced, the latter-formed metal plug 22 contacts with the devices formed therebeneath, which causes short circuit. The possible undesired metal vias are as shown in FIG. 2A and FIG. 2B. Referring to FIG. 2A, due to the misalignment and overetching during the formation of the via, the metal plug 22 penetrates the inter-metal dielectric layer 21, which therefore results in short circuit. Referring to FIG. 2B, even the metal plug 24 does not penetrate the inter-metal dielectric layer, a gap 26 is formed due to misalignment. The gap 26 causes difficulty in metal filling.

Forming an etching stop layer over the first metal wiring line has been proposed to dissolve the above-mentioned problem. However, forming an etching stop layer over a already formed first metal wiring line is a task.

SUMMARY OF THE INVENTION

It is therefore an object of the invention to provide a method of fabricating an unlanded via in the process of multi-level interconnection. This method combines damascene scheme to overcome difficulty of filling metal in the gap of the inter-metal dielectric layer.

It therefore another object of the invention to provide a method of fabricating an unlanded via in the process of multi-level interconnection. This method combines damascene scheme and etching stop layer to avoid overetching.

A method of fabricating an unlanded metal via of multi-level interconnection is disclosed. A first inter-metal dielectric layer and an etching stop layer are sequentially formed over a substrate. The etching stop layer and the first inter-metal dielectric layer are then patterned to form a metal wiring line trench. A first metal layer is formed to fill the metal wiring line trench. A chemical mechanical polish process is performed to remove additional first metal layer remaining over the etching stop layer so that a first metal wiring line layer is formed. Next, a second inter-metal dielectric layer is formed over the etching stop layer and the first metal wiring line. Then, the second inter-metal dielectric layer is patterned, using the etching stop layer as an etching stop, to form a metal via which exposes the first metal wiring line layer.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENT

FIGS. 3A to 3E are cross-sectional views showing a process flow of fabricating an unlanded via of multi-level interconnection according to a preferred embodiment of the invention. A single layer interconnection is taken as an example herein. However, the invention is not limited to single-layer interconnection but applicable to multi-level interconnection.

Figure 1A:
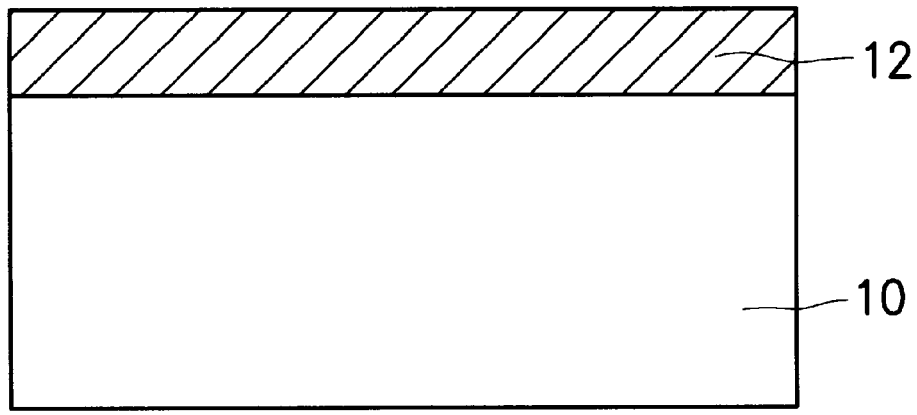
FIGS. 1A to 1D are cross-sectional views showing a conventional process flow of fabricating an unlanded via of multi-level interconnection.
Figure 1B:
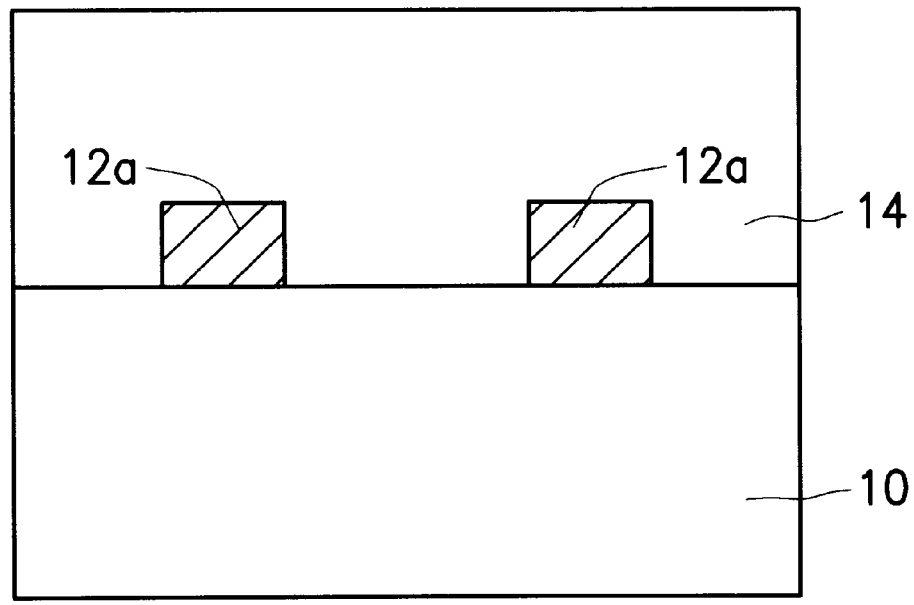
Figure 1C:
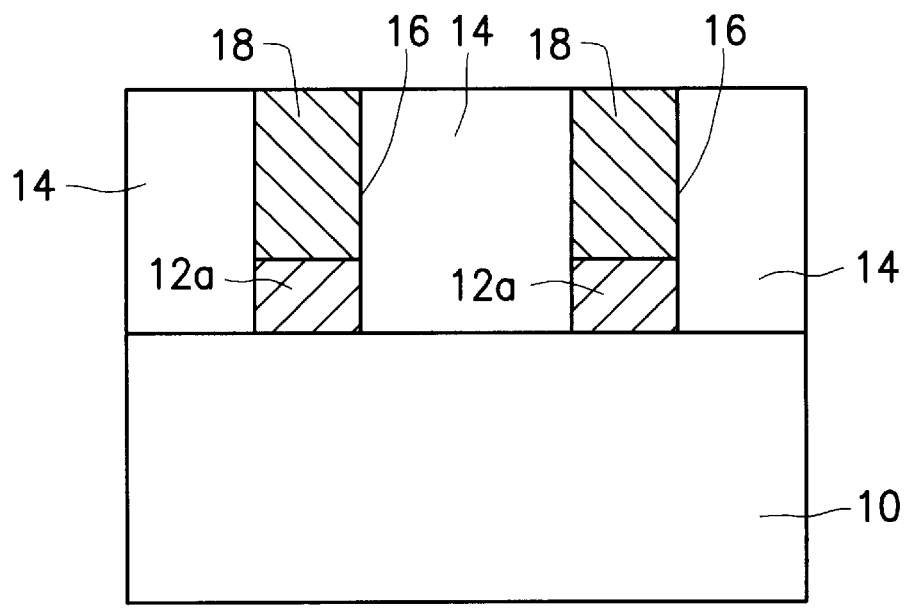
Figure 1D:
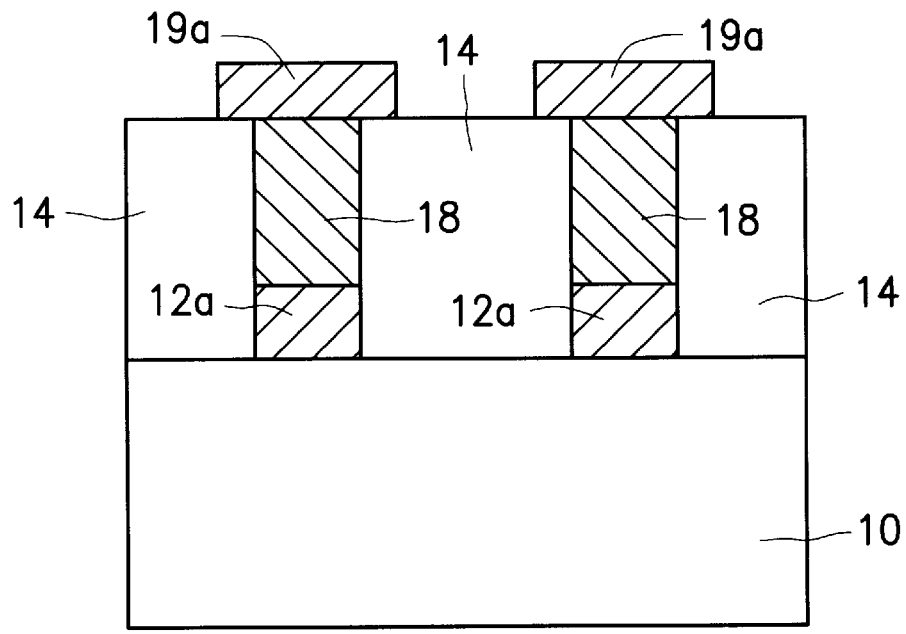
Figure 2A:
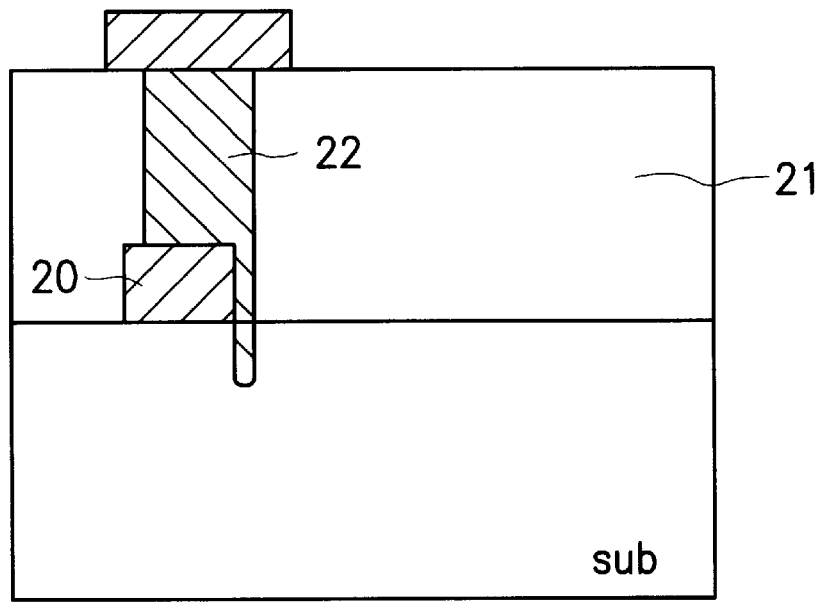
FIGS. 2A to 2B are cross-sectional views showing overetched unlanded vias according to the conventional process flow.
Figure 2B:
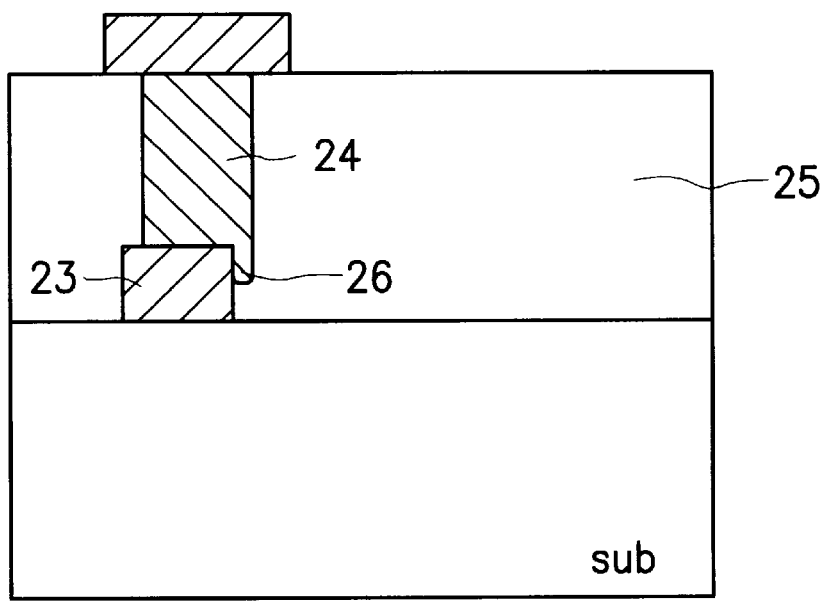
Figure 3A:
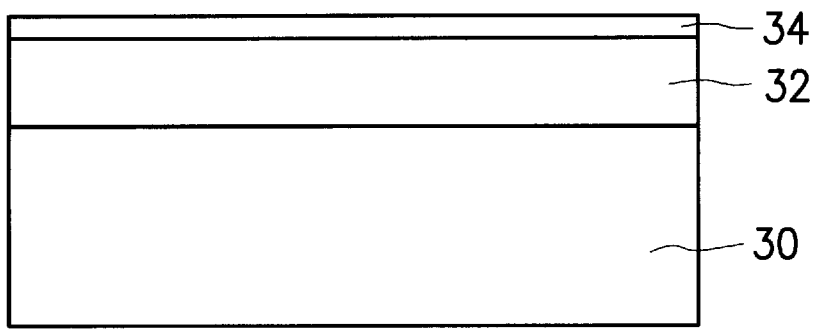
FIGS. 3A to 3E are cross-sectional views showing a process flow of fabricating an unlanded via of multi-level interconnection according to a preferred embodiment of the invention.

Referring first to FIG. 3A, over a substrate 30 with at least a MOS device formed thereon, a first inter-metal dielectric layer 32 and an etching stop layer 34 are sequentially formed. The first inter-metal dielectric layer 32 can be, for example, silicon dioxide layer. The etching stop layer 34 can be, for example, silicon nitride or silicon rich oxide layer.

Figure 3B:
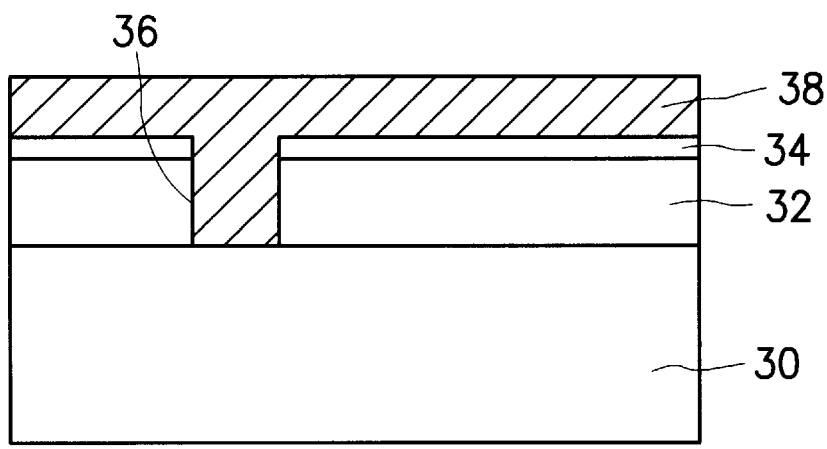
Figure 3C:
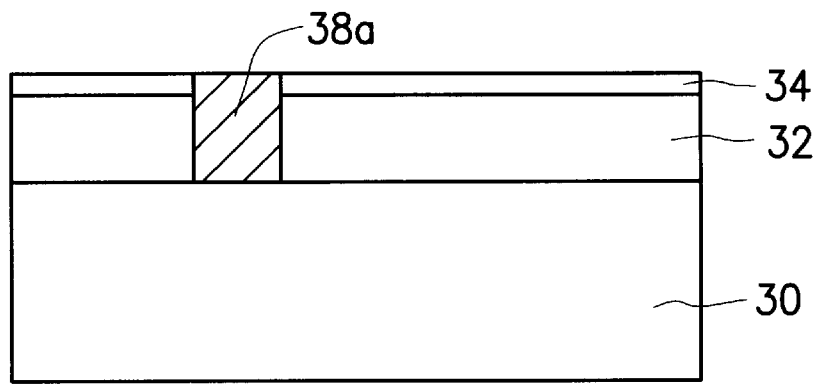

Referring to FIG. 3B, the inter-metal dielectric layer 32 and the etching stop layer 34 are patterned to form wiring line trenches 36. Next, a metal layer 38, such as aluminum or copper, is deposited to at least fill the wiring line trenches 36. The metal layer 38 is then processed through chemical mechanical polish to remove the additional metal remains on the etching stop layers 34. The first metal wiring line 38a are therefore formed, as shown in FIG. 3C.

Figure 3D:
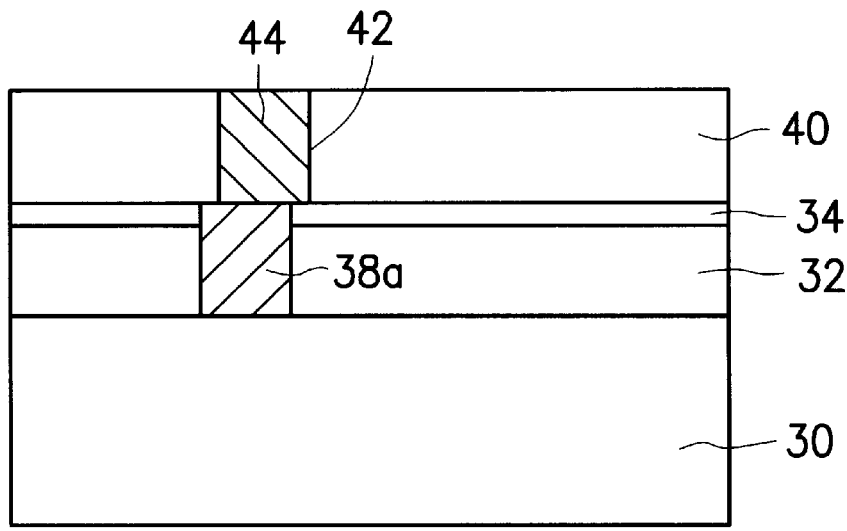

Referring to FIG. 3D, a second inter-metal dielectric layer 40, such as a silicon dioxide layer, is formed over the etching stop layer 34 and the first metal wiring line layer 38a. The second inter-metal dielectric layer 40 is then patterned, using the etching stop layer 34 as an etching stop, to form a metal via 42 which exposes the first metal wiring line 38a. During the etching process of forming the metal via 42, the first inter-metal dielectric layer 32 is protected by the etching stop layer 34 from being etched because the material of the second inter-metal dielectric layer 32 and the material of the etching stop layer are different. Overetching is therefore prevented. A metal plug 44, such as tungsten plug, is formed in the metal via 42.

Figure 3E:
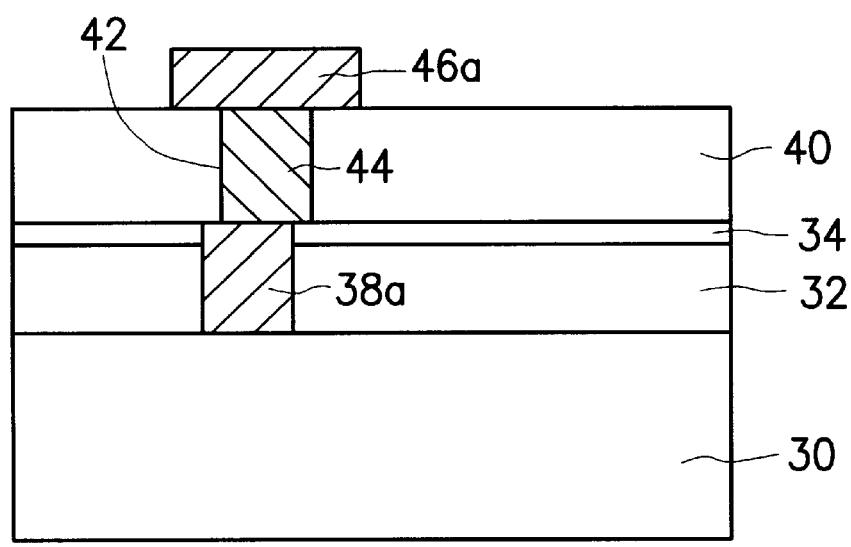

Referring to FIG. 3E, a metal layer 46, such as aluminum, is deposited over the second inter-metal dielectric layer 40 and the metal plug 44. The metal layer 46 is then patterned to form a metal wiring line 46a which couple to the metal plug 44. The back-end processes are similar to the conventional steps so that they are not described herein.

The metal via of the invention has the following characteristics:

1. Forming the first metal wiring line by damascene scheme simplifies the process and also prevents the difficulty of metal etching and inter-metal dielectric layer gap filling.
2. Overetching and short circuit are prevented during the process of etching the metal via because an etching stop layer is formed over the first inter-metal dielectric layer.
3. The etching stop layer can be easily formed over the first dielectric layer by using the damascene scheme.

While the invention has been described by way of example and terms of a preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method of fabricating an unlanded metal via of a multi-level interconnection, comprising the steps of:

forming a first inter-metal dielectric layer over a substrate;

forming an etching stop layer on the first inter-metal dielectric layer;

patterning the etching stop layer and the first inter-metal dielectric layer to form a metal wiring line trench;

forming a first metal layer over the substrate to fill the metal wiring line trench and to contact the substrate;

performing a chemical mechanical polish process to remove a portion of the first metal layer until the etching stop layer is exposed so that a first metal wiring line layer is formed in the metal wiring line trench;

forming a second inter-metal dielectric layer on the etching stop layer and the first metal wiring line; and patterning the second inter-metal dielectric layer, using the etching stop layer as an etching stop, to form a metal via which exposes the first metal wiring line layer.

2. A method as claimed in claim 1, wherein the first inter-metal dielectric layer includes silicon dioxide.

3. A method as claimed in claim 1, wherein the etching stop layer includes silicon nitride.

4. A method as claimed in claim 1, wherein the etching stop layer includes silicon rich oxide.

5. A method as claimed in claim 1, wherein the first metal layer includes aluminum or copper.

6. A method as claimed in claim 1, wherein the first inter-metal dielectric layer includes silicon dioxide.

7. A method as claimed in claim 1, after said step of patterning the second inter-metal dielectric layer, further including the steps of:

forming a metal plug in the metal via;

forming a second metal layer over the second inter-metal dielectric layer and the metal plug; and patterning the second metal layer to form a second metal wiring line layer.

8. A method as claimed in claim 1, wherein the second metal layer includes aluminum or copper.

9. A method of fabricating an unlanded metal via of a multi-level interconnection, comprising the steps of:

forming a first inter-metal dielectric layer over a substrate;

forming an etching stop layer sequentially over the first inter-metal dielectric layer;

forming a metal wiring line trench in the etching stop layer and the first inter-metal dielectric layer to expose the substrate;

forming a first metal layer to fill the metal wiring line trench and to form an electrical connection between the substrate and the first metal layer;

performing a planarization process to planarize the first metal layer over the etching stop layer so that a first metal wiring line layer is formed, wherein the planarization process is stopped when the etching stop layer is exposed;

forming a second inter-metal dielectric layer over the etching stop layer and the first metal wiring line; and etching the second inter-metal dielectric layer to form a metal via that exposes the first metal wiring line layer by using the etching stop layer as an etching stop to prevent material other than the second inter-metal dielectric layer from being removed.

* * * * *